United States Patent
Sato et al.

(10) Patent No.: US 8,754,335 B2
(45) Date of Patent: Jun. 17, 2014

(54) CERAMIC ELECTRONIC COMPONENT AND WIRING BOARD

(75) Inventors: Koji Sato, Nagaokakyo (JP); Yukio Sanada, Nagaokakyo (JP); Yasuhiro Nishisaka, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 45 days.

(21) Appl. No.: 13/178,530

(22) Filed: Jul. 8, 2011

(65) Prior Publication Data
US 2012/0018204 A1   Jan. 26, 2012

(30) Foreign Application Priority Data
Jul. 21, 2010   (JP) ................... 2010-164113

(51) Int. Cl.
*H05K 1/16* (2006.01)

(52) U.S. Cl.
USPC ......... 174/260; 361/306.3; 361/760; 361/761

(58) Field of Classification Search
CPC ......... H01G 4/232; H01G 4/236; H01G 4/30; H05K 1/182–1/185; H05K 2201/10015; H05K 2203/1469; H01L 23/49822; H01L 23/50

See application file for complete search history.

(56) References Cited

U.S. PATENT DOCUMENTS

| | | | |
|---|---|---|---|
| 6,771,485 B2* | 8/2004 | Yokoyama et al. | 361/309 |
| 6,791,195 B2* | 9/2004 | Urushima | 257/783 |
| 2001/0036711 A1 | 11/2001 | Urushima | |
| 2003/0169556 A1 | 9/2003 | Yokoyama et al. | |
| 2009/0040688 A1* | 2/2009 | Kayatani | 361/321.1 |
| 2009/0116168 A1* | 5/2009 | Block et al. | 361/306.3 |
| 2009/0284896 A1 | 11/2009 | Sakaguchi et al. | |
| 2010/0025847 A1* | 2/2010 | Tomura et al. | 257/737 |
| 2010/0123994 A1 | 5/2010 | Nishisaka et al. | |
| 2010/0128411 A1 | 5/2010 | Onishi et al. | |
| 2010/0224397 A1* | 9/2010 | Shimizu et al. | 174/260 |

FOREIGN PATENT DOCUMENTS

| | | | |
|---|---|---|---|
| JP | 09-007878 A | | 1/1997 |
| JP | 09007878 A | * | 1/1997 |
| JP | 2001-308140 A | | 11/2001 |
| JP | 2001-352141 A | | 12/2001 |
| JP | 2003-309373 A | | 10/2003 |
| JP | 2004-087717 A | | 3/2004 |
| JP | 2004087717 A | * | 3/2004 |

(Continued)

OTHER PUBLICATIONS

Official Communication issued in corresponding Japanese Patent Application No. 2010-164113, mailed on Nov. 27, 2012.

*Primary Examiner* — Hoa C Nguyen
*Assistant Examiner* — Amol Patel
(74) *Attorney, Agent, or Firm* — Keating & Bennett, LLP

(57) ABSTRACT

A ceramic electronic component includes a ceramic element body having a substantially rectangular parallelepiped shape, and first and second external electrodes. The first and second external electrodes are provided on a first principal surface. Portions of the first and second external electrodes project further than the other portions in a thickness direction. A projecting portion of the first external electrode is provided at one end of the first external electrode in a length direction and a second projecting portion of the second external electrode is provided at another end of the second external electrode in the length direction. Thus, a concave portion is provided between the projecting portions, and a portion of the first principal surface provided between the first and second external electrodes is exposed.

7 Claims, 15 Drawing Sheets

(56) References Cited

FOREIGN PATENT DOCUMENTS

| JP | 2009-253010 A | 10/2009 |
| JP | 2009253010 A * | 10/2009 |
| WO | 2008/078746 A1 | 7/2008 |

* cited by examiner

CERAMIC ELECTRONIC COMPONENT AND WIRING BOARD

BACKGROUND OF THE INVENTION

1. Field of the Invention

The present invention relates to a ceramic electronic component and a wiring board. More particularly, the present invention relates to a ceramic electronic component suitably used while being embedded in a wiring board, and to a ceramic-electronic-component embedded wiring board in which the ceramic electronic component is embedded.

2. Description of the Related Art

With recent reduction in size and thickness of electronic apparatuses, such as mobile telephones and portable music players, the sizes of wiring boards to be mounted in the electronic apparatuses have been reduced.

For example, Japanese Unexamined Patent Application Publication No. 2001-352141 discloses a method for reducing the size of a wiring board, in which a chip capacitor is embedded in a wiring board, a through hole is formed in a portion of the wiring board above the chip capacitor with a laser, and the inside of the through hole is plated to form wiring to the chip capacitor. According to this method, it is possible to reduce the mounting area of the component on a surface of the wiring board and to thereby reduce the size of the wiring board.

However, when the chip capacitor is embedded in the wiring board, as in Japanese Unexamined Patent Application Publication No. 2001-352141, the overall reliability of the wiring board decreases.

Through intensive studies, the inventors of the present invention discovered that the chip-capacitor embedded wiring board described in Japanese Unexamined Patent Application Publication No. 2001-352141 lacked reliability for the following reasons. That is, in the chip-capacitor embedded wiring board described above, the chip capacitor is provided on a base substrate, and the chip capacitor and the base substrate are bonded with adhesive. However, since the entire wraparound portion of an external electrode contacts the base substrate, the adhesive does not properly enter between the external electrode and the base substrate, and the thickness of a layer of the adhesive becomes too small between the external electrode and the base substrate. This decreases the adhesion strength and the adhesive is not provided. As a result, a gap is formed between the external electrode and the base substrate.

Further, when the through hole is formed by a laser, a residue of resin that forms the wiring board is produced, and desmearing is sometimes performed to remove the residue of resin. During desmearing, the wiring board is exposed to a strong alkaline solution, such as potassium permanganate. In this case, the solution enters the gap and remains therein. This solution reduces reliability.

SUMMARY OF THE INVENTION

To overcome the problems described above, preferred embodiments of the present invention provide a ceramic electronic component that improves the reliability of a ceramic-electronic-component embedded wiring board.

A ceramic electronic component according to a preferred embodiment of the present invention preferably includes a ceramic element body having a substantially rectangular parallelepiped shape, first and second internal electrodes, a first external electrode, and a second external electrode. The ceramic element body includes first and second principal surface, first and second side surfaces, and first and second end surfaces. The first and second principal surfaces extend in a length direction and a width direction and face each other. The first and second side surfaces extend in the length direction and a thickness direction and face each other. The first and second end surfaces extend in the width direction and the thickness direction and face each other. The first and second internal electrodes are preferably arranged in the ceramic element body such that at least portions of the first and second internal electrodes face each other in the thickness direction. The first external electrode is provided on one end of the first principal surface in the length direction and is electrically connected to the first internal electrode. The second external electrode is provided on the other end of the first principal surface in the length direction and is electrically connected to the second internal electrode. Portions of the first and second external electrodes face, in the thickness direction, the at least portions of the first and second internal electrodes facing each other in the thickness direction. The first and second external electrodes preferably include projecting portions that project more than the other portions in the thickness direction. The projecting portion of the first external electrode is provided at one end of the first external electrode in the length direction and the projecting portion of the second external electrode is provided at one end of the second external electrode in the length direction so that a concave portion is provided between the projecting portion of the first external electrode and the projecting portion of the second external electrode and so that a portion of the first principal surface provided between the first external electrode and the second external electrode is exposed.

Preferably, the outermost layers of the first and second external electrodes are made of any one of Cu, Al, Au, and Ag or an alloy primarily including any one of the metals, for example.

A wiring board according to another preferred embodiment of the present invention preferably includes the ceramic electronic component according to the preferred embodiment of the present invention described above, and a wiring board body in which the ceramic electronic component is embedded.

Preferably, the wiring board body includes a base substrate and an adhesive provided between the base substrate and the ceramic electronic component so as to bond the base substrate and the ceramic electronic component.

Preferably, the base substrate includes through holes opening toward the first and second external electrodes of the ceramic electronic component.

In various preferred embodiments of the present invention, since the projecting portions of the external electrodes project more than the other portions in the thickness direction, when the ceramic electronic component is bonded on the base substrate with the adhesive, a space in which the adhesive enters is ensured between the external electrodes and the base substrate. This enables reliable bonding with high adhesion strength. For this reason, it is possible to prevent entry of treatment liquid between the external electrodes and the base substrate. Therefore, high reliability is achieved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

A first preferred embodiment of the present invention will be described below by taking a ceramic electronic component 1 illustrated in FIG. 1, as an example. The ceramic electronic component 1 is just exemplary, and the ceramic electronic component according to preferred embodiments of the present invention is not limited thereto.

Figure 1:
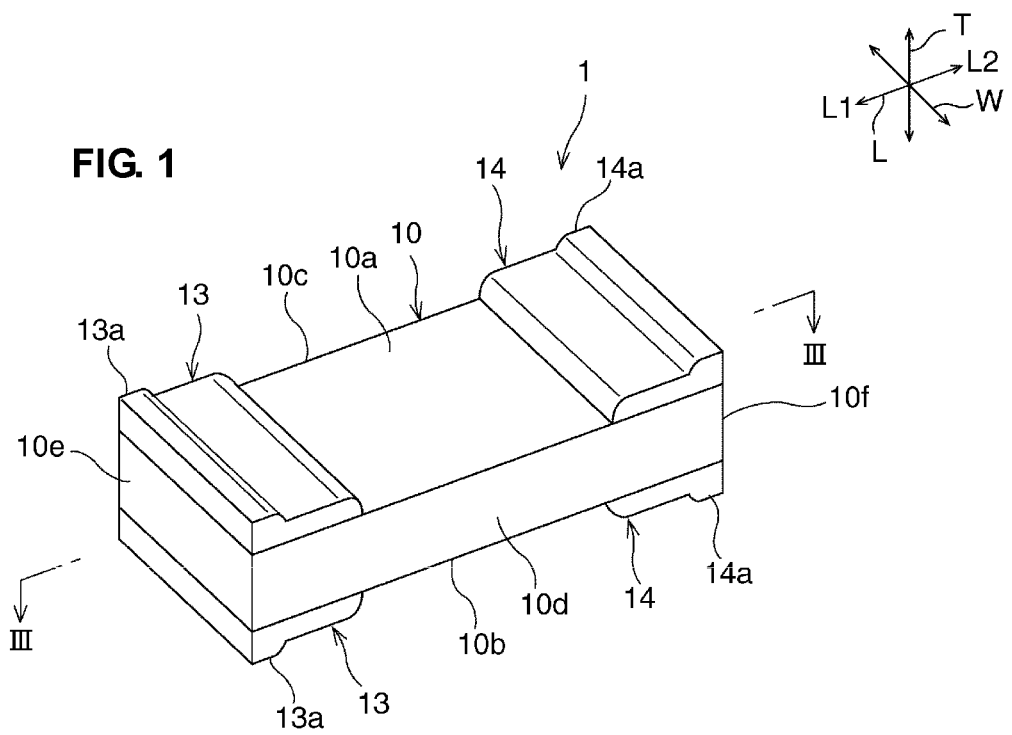
FIG. 1 is a schematic perspective view of a ceramic electronic component according to a first preferred embodiment of the present invention.
Figure 2:
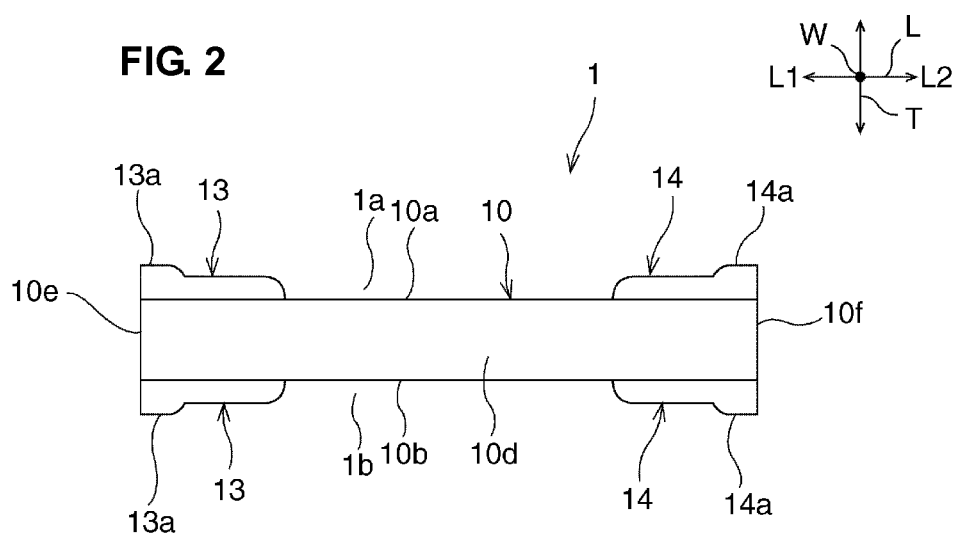
FIG. 2 is a schematic side view of the ceramic electronic component of the first preferred embodiment of the present invention.
Figure 3:
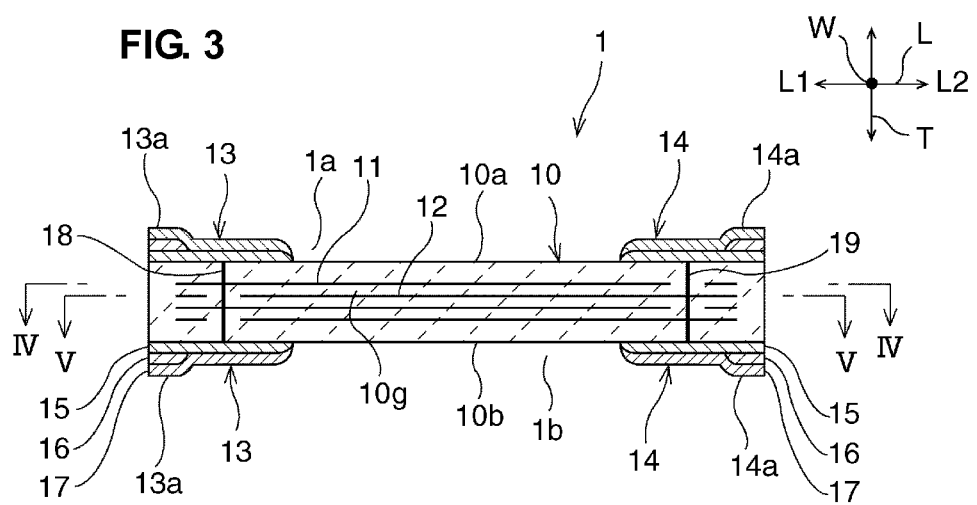
FIG. 3 is a schematic cross-sectional view, taken along line III-III of FIG. 1.
Figure 4:
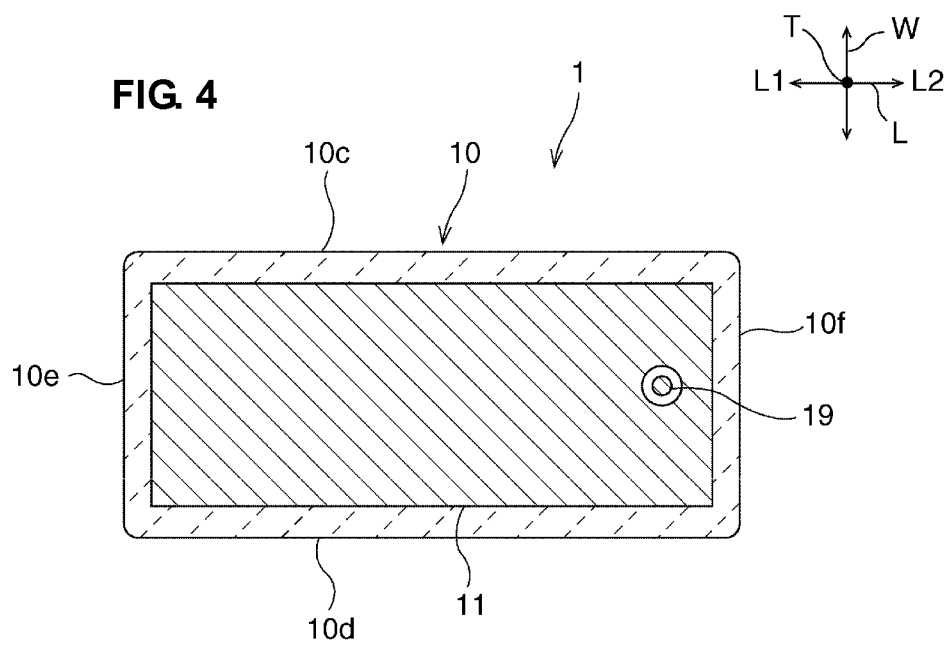
FIG. 4 is a schematic sectional view, taken along line IV-IV of FIG. 3.
Figure 5:
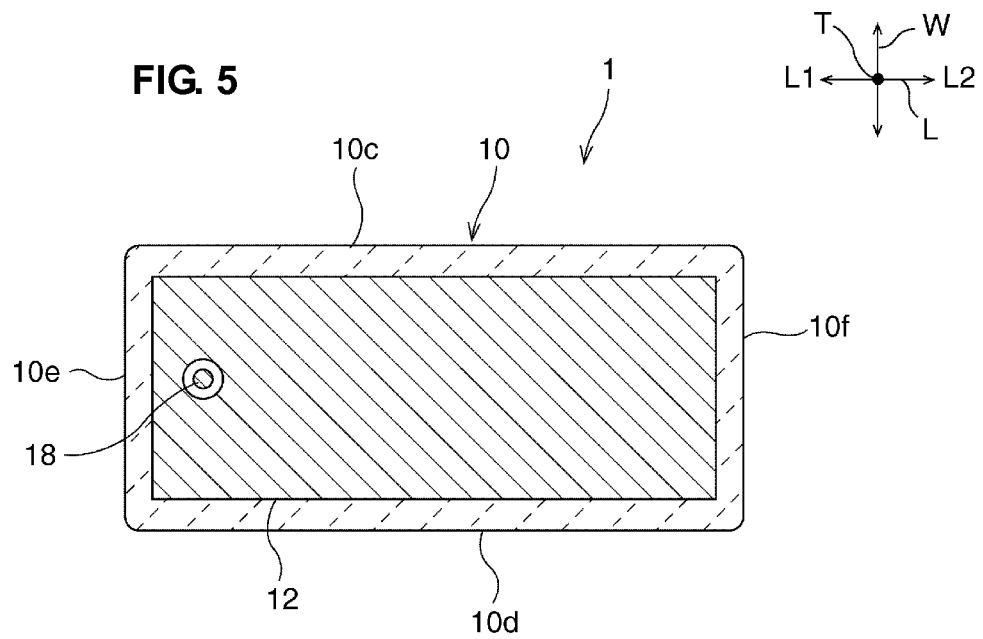
FIG. 5 is a schematic sectional view, taken along line V-V of FIG. 3.

FIG. 1 is a schematic perspective view of the ceramic electronic component 1 of the first preferred embodiment. FIG. 2 is a schematic side view of the ceramic electronic component 1. FIG. 3 is a schematic cross-sectional view, taken along line III-III of FIG. 1. FIG. 4 is a schematic sectional view taken along line IV-IV of FIG. 3. FIG. 5 is a schematic sectional view taken along line V-V of FIG. 3.

First, the structure of the ceramic electronic component 1 will be described with reference to FIGS. 1 to 5.

As illustrated in FIGS. 1 to 5, the ceramic electronic component 1 preferably includes a ceramic element body 10. The ceramic element body 10 is preferably made of an appropriate ceramic material selected in accordance with the function of the ceramic electronic component 1. More specifically, when the ceramic electronic component 1 is a capacitor, the ceramic element body 10 can preferably be made of a dielectric ceramic material such as $BaTiO_3$, $CaTiO_3$, $SrTiO_3$, or $CaZrO_3$, for example. When the above-described ceramic material defines a main ingredient, an accessory ingredient, such as a Mn compound, a Mg compound, a Si compound, a Fe compound, a Cr compound, a Co compound, a Ni compound, or a rare-earth compound, for example, may prefer-ably be appropriately added to the ceramic body 10 in accordance with a desired characteristic of the ceramic electronic component 1.

When the ceramic electronic component 1 is a ceramic piezoelectric element, the ceramic element body 10 can be made of a piezoelectric ceramic material, such as a lead zirconate titanate (PZT) ceramic material, for example.

When the ceramic electronic component 1 is a thermistor element, the ceramic element body 10 can preferably be made of a semiconductor ceramic material, such as a spinel ceramic material, for example.

When the ceramic electronic component 1 is an inductor element, the ceramic element body 10 can preferably be made of a magnetic ceramic material, such as a ferrite ceramic material, for example.

The ceramic element body 10 preferably has a substantially rectangular parallelepiped shape, for example. As illustrated in FIGS. 1 to 3, the ceramic element body 10 includes a first principal surface 10a and a second principal surface 10b extending in a length direction L and a width direction W. As illustrated in FIGS. 1, 2, 4, and 5, the ceramic element body 10 also includes a first side surface 10c and a second side surface 10d extending in a thickness direction T and the length direction L. Further, as illustrated in FIGS. 1 to 5, the ceramic element body 10 also includes a first end surface 10e and a second end surface 10f extending in the thickness direction T and the width direction W.

In the present specification, the term "substantially rectangular parallelepiped" includes a rectangular parallelepiped having chamfered or rounded corners and ridges. That is, the member shaped like a substantially rectangular parallelepiped refers to members in general which include first and second principal surfaces, first and second side surfaces, and first and second end surfaces. Some or all of the principal surfaces, the side surfaces, and the end surfaces may include irregularities.

While the dimensions of the ceramic element body 10 are not particularly limited, the ceramic element body 10 is preferably thin so as to satisfy the condition that $T \leq W < L$, $\frac{1}{5}W \leq T \leq \frac{1}{2}W$, and $T \leq 0.3$ mm when T, L, and W respectively represent the thickness, length, and width of the ceramic element body 10. More specifically, the ceramic element body 10 preferably satisfies the condition that $0.1 \text{ mm} \leq T \leq 0.4 \text{ mm}$, $0.4 \text{ mm} \leq L \leq 1 \text{ mm}$, and $0.2 \text{ mm} \leq W \leq 0.5 \text{ mm}$, for example.

As illustrated in FIG. 3, in the ceramic element body 10, a plurality of first internal electrodes 11 and a plurality of second internal electrodes 12 each having a substantially rectangular shape are preferably alternately arranged at regular intervals in the thickness direction T. The first and second internal electrodes 11 and 12 are parallel or substantially parallel to the first and second principal surfaces 10a and 10b. The first internal electrodes 11 and the second internal electrodes 12 face each other with ceramic layers 10g being disposed therebetween in the thickness direction T. The first and second internal electrodes 11 and 12 are not exposed from any of the first and second principal surfaces 10a and 10b, the first and second side surfaces 10c and 10d, and the first and second end surfaces 10e and 10f.

The thickness of the ceramic layers 10g is not particularly limited, and for example, can preferably be about 0.5 μm to about 10 μm. The thickness of the first and second internal electrodes 11 and 12 is also not particularly limited, and for example, can be about 0.3 μm to about 2 μm.

The first and second internal electrodes 11 and 12 can preferably be made of an appropriate conductive material, for example, any of Ni, Cu, Ag, Pd, and Au, or an alloy including at least one of these metals, such as a Ag—Pd alloy, for example.

First and second external electrodes 13 and 14 are provided on each of the first and second principal surfaces 10a and 10b of the ceramic element body 10. As illustrated in FIG. 3, the first internal electrodes 11 are preferably electrically connected to the first external electrodes 13 by a via-hole electrode 18. The second internal electrodes 12 are not electrically connected to the first external electrodes 13. In contrast, the second internal electrodes 12 are preferably electrically connected to the second external electrodes 14 by a via-hole electrode 19. The first internal electrodes 11 are not electrically connected to the second external electrodes 14.

As illustrated in FIGS. 1 to 3, the first external electrodes 13 are provided on L1-side ends of the first and second principal surfaces 10a and 10b in the length direction L. In contrast, the second external electrodes 14 are provided on L2-side ends of the first and second principal surfaces 10a and 10b in the length direction L. Portions of the first and second principal surfaces 10a and 10b between the first and second external electrodes 13 and 14 are preferably exposed. That is, nothing is provided on the portions of the first and second principal surfaces 10a and 10b between the first and second external electrodes 13 and 14.

Preferably, the length of the first and second external electrodes 13 and 14 in the length direction L is about 230 μm to about 330 μm, for example.

Each of the first and second external electrodes 13 and 14 preferably include a laminate of first to third conductive layers 15 to 17. The first conductive layers 15 are provided on the first and second principal surface 10a and 10b, and extend from one end to the other end of the first and second principal surface 10a and 10b in the width direction W. The second conductive layers 16 are preferably provided on portions of the first conductive layers 15. More specifically, the second conductive layers 16 are provided on only L1-side end and L2-side end of the first conductive layers 15 in the length direction L. The second conductive layers 16 extend from the one end to the other end of the first and second principal surface 10a and 10b in the width direction W. The third conductive layers 17 define the outermost layers of the first and second external electrodes 13 and 14, and cover the first and second conductive layers 15 and 16. For this reason, in the first preferred embodiment, the ends of the first and second external electrodes 13 and 14 include projecting portions 13a and 14a that project more than other portions in the thickness direction T. As illustrated in FIGS. 2 and 3, concave portions 1a and 1b are preferably provided between the projecting portions 13a and 14a in the length direction L. The concave portions 1a and 1b are stepped indentations defined by the exposed portions of the first and second principal surfaces 10a and 10b defining bottom surfaces, the projecting portions 13a and 14a define upper step portions, and portions other than the projecting portions 13a and 14a define lower step portions. Surfaces of the lower step portions are relatively flat, and these portions define laser irradiation areas.

For example, the thickness of the portions of the first and second external electrodes 13 and 14 other than the projecting portions 13a and 14a is preferably about 3 μm to about 20 μm, for example, and the maximum thickness of the projecting portions 13a and 14a is preferably about 2 μm to about 10 μm, for example.

The first and second conductive layers 15 and 16 can be made of an appropriately conductive material, for example, any of Ni, Cu, Ag, Pd, and Au, or an alloy including at least one of these metals, such as an Ag—Pd alloy, for example.

The thicknesses of the first and second conductive layers 15 and 16 can preferably be about 3 μm to about 20 μm, for example.

The first and second conductive layers 15 and 16 preferably include an inorganic binder. The inorganic binder is an ingredient that increases the adhesion strength to the ceramic element body 10. When the first and second conductive layers 15 and 16 are formed by co-firing, for example, the inorganic binder may be the same type of ceramic material as the ceramic material included in the ceramic element body 10, which is also referred to as a common material. Alternatively, the inorganic binder may be a ceramic material whose principal ingredient is the same as that of the ceramic material included in the ceramic element body 10. When the first and second conductive layers 15 and 16 are formed by post-firing, the inorganic binder may be a glass component, for example.

For example, the content of the inorganic binder in the first and second conductive layers 15 and 16 is preferably within the range of about 40 volume percent to about 60 volume percent.

For example, the third conductive layers 17 are preferably formed of plating of one metal selected from a group of Cu, Ni, Sn, Pb, Au, Ag, Pd, Bi, and Zn or an alloy including the selected metal. It is more preferable that the third conductive layers 17 be made of one of Cu and Al, or an alloy including at least one of Cu and Al, for example. For this reason, in the first preferred embodiment, the outermost layers of the first and second external electrodes 13 and 14 are preferably made of one of Cu, Al, Au, and Ag, or an alloy primarily including the metal, for example. The first and second external electrodes 13 and 14 made of one of Cu, Al, Au, and Ag, or the alloy primarily including the metal are highly reflective for laser light. For example, after the ceramic electronic component 1 is embedded in a wiring board, via holes in the first and second external electrodes 13 and 14 can be formed in the wiring board using laser light.

Preferably, the third conductive layers 17 are formed by plating films, and have a thickness of about 1 μm to about 15 μm, for example.

In addition, the third conductive layers 17 preferably completely cover the first and second conductive layers 15 and 16.

In addition, further conductive layers, such as plating films, may be provided between the third conductive layers 17 and the first and second conductive layers 15 and 16.

Next, a description will be provided of a production method for the ceramic electronic component 1 of the first preferred embodiment.

Figure 6:
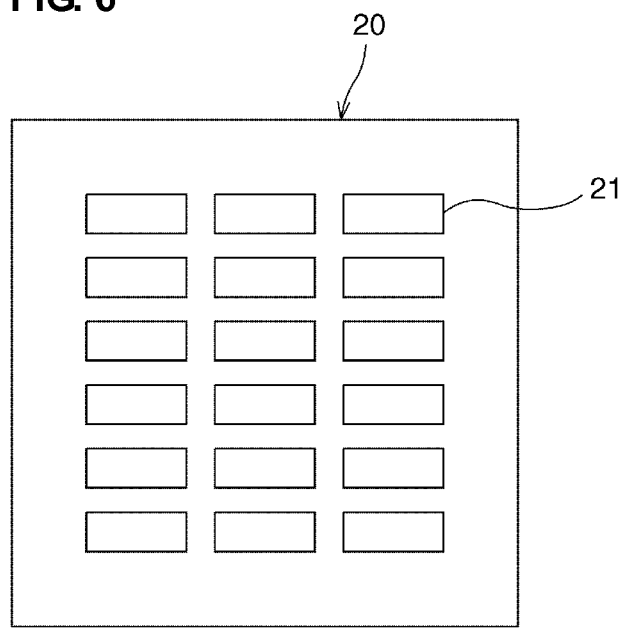
FIG. 6 is a schematic plan view of a ceramic green sheet on which a conductive pattern is provided.

First, a ceramic green sheet 20 including a ceramic material that forms a ceramic element body 10 (see FIG. 6) is prepared. Next, as illustrated in FIG. 6, a conductive pattern 21 is formed by applying a conductive paste on the ceramic green sheet 20. The conductive paste can be applied by various printing methods, such as screen printing, for example. The conductive paste may include known binders and solvents in addition to conductive microparticles.

Figure 7:
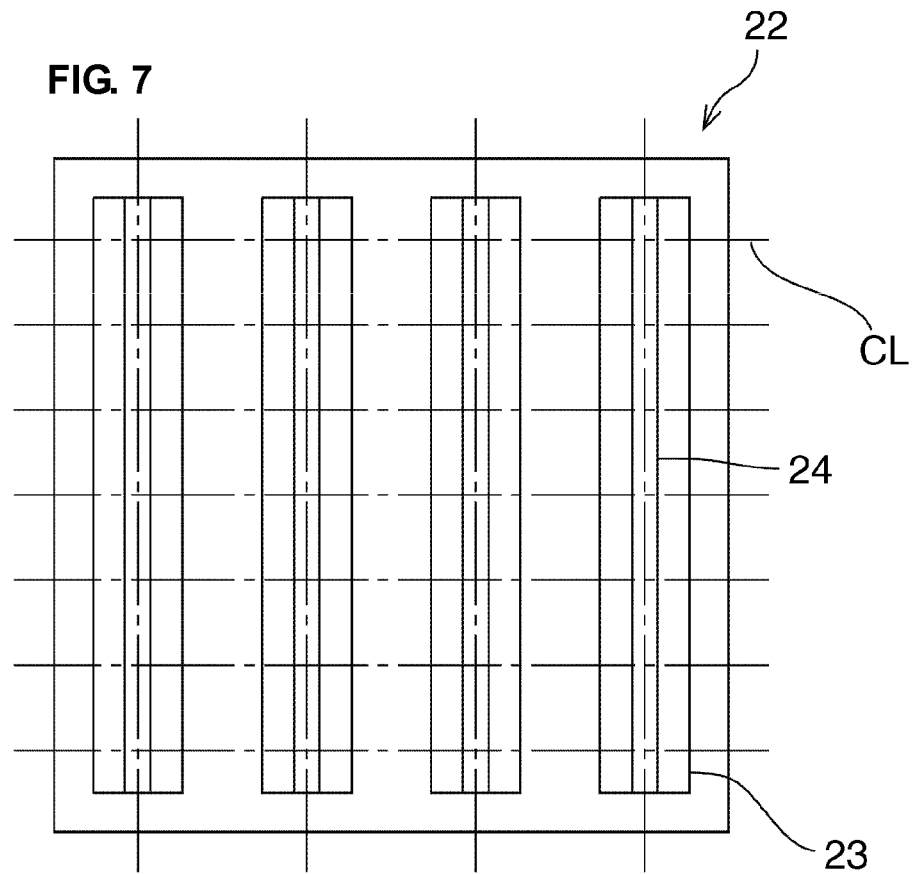
FIG. 7 is a schematic plan view of a mother laminated body.

Next, a plurality of ceramic green sheets 20 including no conductive pattern 21, ceramic green sheets 20 on which conductive patterns 21 shaped in correspondence with the first and second internal electrodes 11 and 12 are provided, and a plurality of ceramic green sheets 20 including no conductive pattern 21 are stacked in this order, and are subjected to isostatic pressure in the stacking direction, so that a mother laminated body 22 is formed, as illustrated in FIG. 7.

Next, a conductive pattern 23 arranged to form first conductive layers 15 of first and second external electrodes 13 and 14 is formed on the mother laminated body 22 by an appropriate printing method, such as screen printing, for example. Further, a conductive pattern 24 arranged to form second conductive layers 16 are formed on the conductive pattern 23 by an appropriate printing method, such as screen printing, for example.

Next, the mother laminated body 22 is cut along cut lines CL so as to obtain a plurality of ceramic green laminated bodies. The mother laminated body 22 can be cut by dicing or force-cutting, for example.

After the ceramic green laminated bodies are formed, edges of the ceramic green laminated bodies may be chamfered or rounded, and surfaces thereof may be polished by barrel polishing or other suitable methods, for example.

Next, the ceramic green laminated bodies are fired. The firing temperature can be appropriately set in accordance with the types of the ceramic material and conductive paste to be used. The firing temperature may preferably be about 900° C. to about 1300° C., for example.

Finally, third conductive layers 17 are formed by plating, and a ceramic electronic component 1 is produced.

The ceramic electronic component 1 of the first preferred embodiment is suitably used while being embedded in the wiring board. Next, a description will be provided of a production method for a ceramic-electronic-component embedded wiring board in which the ceramic electronic component 1 is embedded, with reference to FIGS. 8 to 12.

Figure 8:
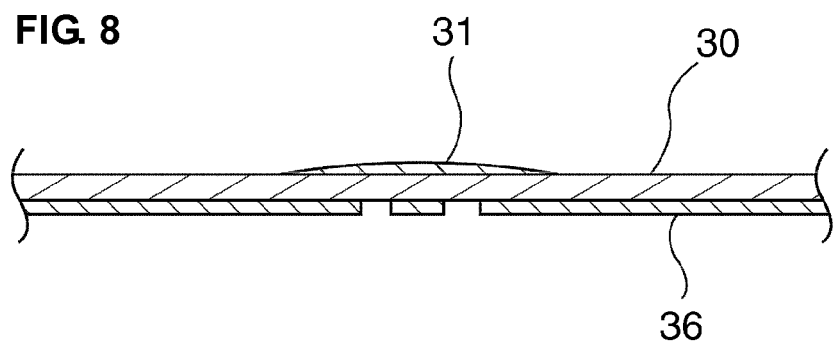
FIG. 8 is a schematic cross-sectional view illustrating a step of applying adhesive onto a base substrate.

First, as illustrated in FIG. 8, adhesive 31 is applied onto a base substrate 30. The base substrate 30 is not particularly limited, and can be defined, for example, by a board of resin, such as glass epoxy resin. The thickness of the base substrate 30 is also not particularly limited, and may preferably be about 25 μm to 50 μm, for example. As the adhesive 31, an epoxy resin adhesive can preferably be used as an example. Alternatively, the adhesive 31 may be a heat-curing resin adhesive or a light-curing resin adhesive, for example.

Figure 9:
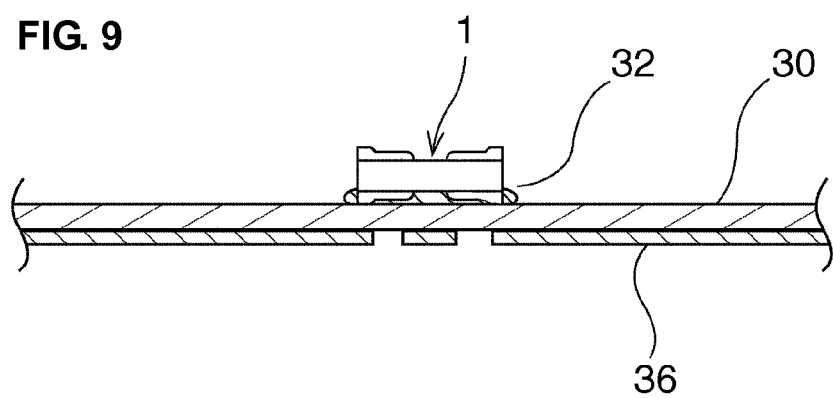
FIG. 9 is a schematic cross-sectional view illustrating a step of bonding the ceramic electronic component to the base substrate.

Next, a ceramic electronic component 1 is disposed on the adhesive 31, and the adhesive 31 is cured to form an adhesive material 32, as illustrated in FIG. 9, so that the ceramic electronic component 1 is bonded to the base substrate 30.

Figure 10:
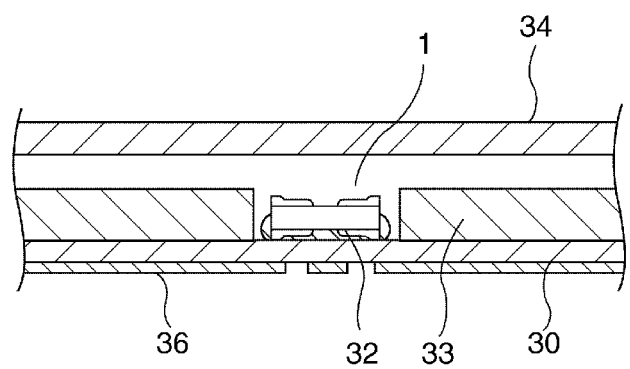
FIG. 10 is a schematic cross-sectional view illustrating a step of forming a wiring board body.
Figure 11:
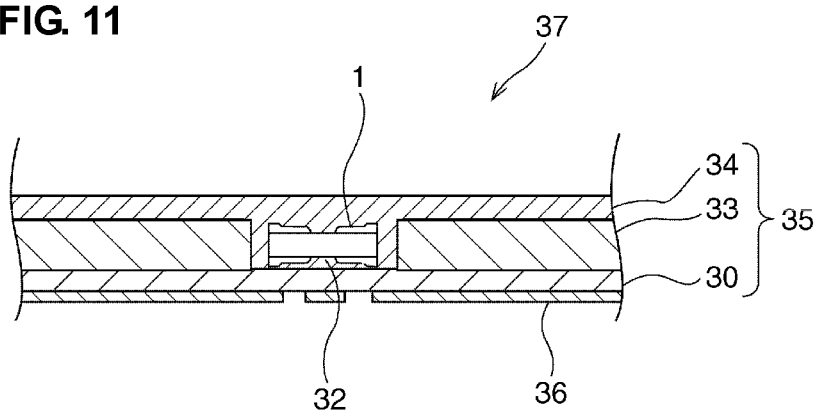
FIG. 11 is a schematic cross-sectional view illustrating a step of forming a via hole.
Figure 12:
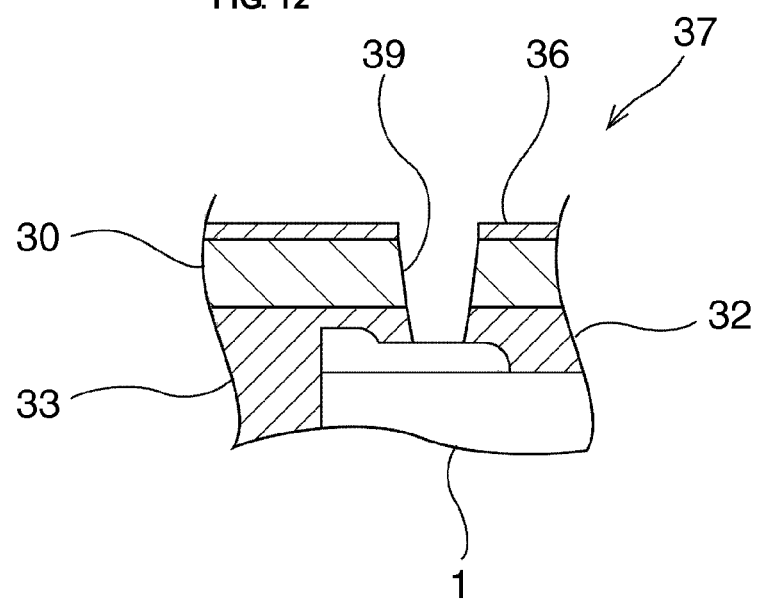
FIG. 12 is an enlarged schematic cross-sectional view of a portion of a wiring board.

Next, as illustrated in FIG. 10, a core material 33 is preferably disposed on a portion of the base substrate 30 at which the ceramic electronic component 1 is not provided. A sheet 34 including semi-cured curable resin is pressed against the core material 33 and the ceramic electronic component 1, and the sheet 34 is completely cured in this state. Consequently, as illustrated in FIG. 11, a wiring board 37 in which the ceramic electronic component 1 is embedded in a wiring board body 35 including the base substrate 30, the core material 33, and the sheet 34 is produced. For example, the core material 33 can be made of a board of resin, such as glass epoxy resin.

Next, a laser light beam is applied to the base substrate 30 from above a patterned Cu layer 36 (conformal mask method), whereby via holes 39 in the first and second external electrodes 13 and 14 (see FIG. 12) are formed in the wiring board 37. Since the spot diameter of the laser light beam is normally about 100 μm, for example, the length in the length direction L of the portions of the first conductive layers 15 that are not covered with the second conductive layers 16 is preferably about 170 μm to about 250 μm, for example.

After that, desmearing is performed to remove smears adhering to side walls of the via holes 39 and other portions. More specifically, after smears are removed by treatment with a strong alkali, such as potassium permanganate, for example, acid rinsing is performed.

To form conductors connected to the first and second external electrodes 13 and 14 in the via holes 39, plating, such as electroless plating may preferably be performed further.

As described above, in the first preferred embodiment, the first and second external electrodes 13 and 14 preferably include the projecting portions 13a and 14a. For this reason, the thickness of the adhesive material 32 can be increased as compared to when the projecting portions 13a and 14a are not provided. In particular, portions of the adhesive material 32 located between the first and second external electrodes 13 and 14 and the base substrate 30 can be increased in thickness. Thus, a space in which the adhesive enters is provided between the first and second external electrodes 13 and 14 and the base substrate 30. This enables the first and second external electrodes 13 and 14 to be firmly bonded to the base substrate 30. Therefore, moisture or other contaminants do not enter the space between the first and second external electrodes 13 and 14 and the base substrate 30, and this effectively prevents degradation of the first and second external electrodes 13 and 14. Further, since the first and second external electrodes 13 and 14 are firmly bonded to the base substrate 30 with the adhesive material 32, as described above, the solvent or plating solution used for desmearing does not enter between the first and second external electrodes 13 and 14 and the adhesive material 32. Therefore, degradation of the first and second external electrodes 13 and 14 is prevented effectively. As a result, high reliability is achieved.

Other preferred embodiments of the present invention will be described below. In the following description, elements and members having functions substantially common to those of the first preferred embodiment are denoted by the same reference numerals, and descriptions thereof are omitted.

Second and Third Preferred Embodiments

Figure 13:
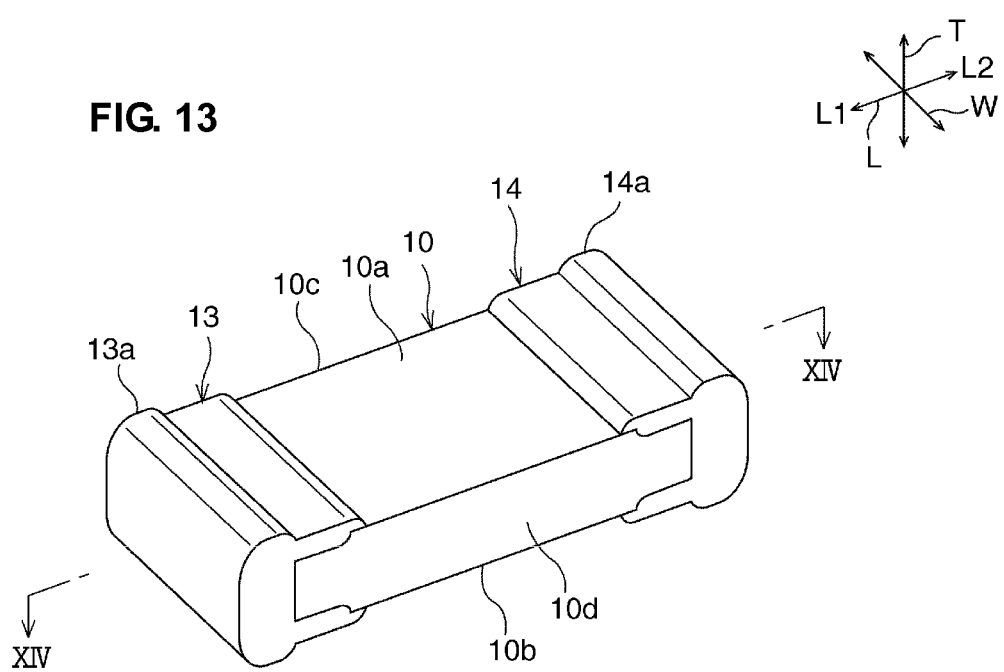
FIG. 13 is a schematic perspective view of a ceramic electronic component according to a second preferred embodiment of the present invention.
Figure 14:
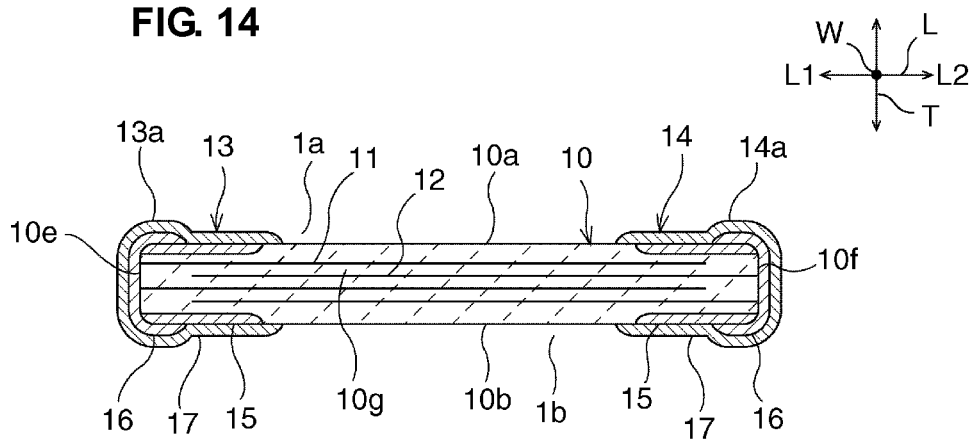
FIG. 14 is a schematic cross-sectional view, taken along line XIV-XIV of FIG. 13.
Figure 15:
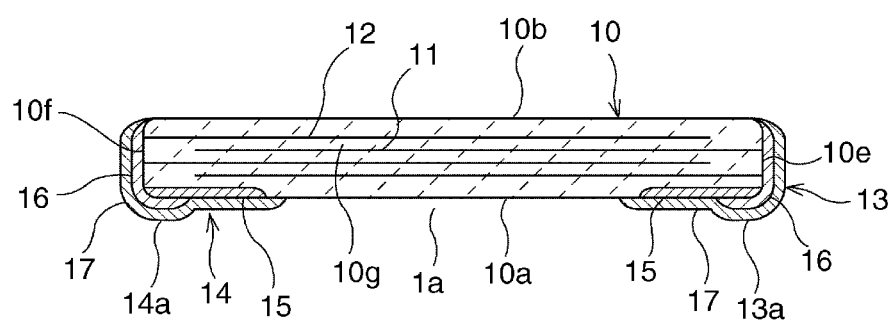
FIG. 15 is a schematic cross-sectional view of a ceramic electronic component according to a third preferred embodiment of the present invention.

FIG. 13 is a schematic perspective view of a ceramic electronic component according to a second preferred embodiment of the present invention. FIG. 14 is a schematic cross-sectional view taken along line XIV-XIV of FIG. 13. FIG. 15 is a schematic cross-sectional view of a ceramic electronic component according to a third preferred embodiment of the present invention.

In the above-described first preferred embodiment, the first and second external electrodes 13 and 14 are preferably provided on each of the first and second principal surfaces 10a and 10b. However, it is only necessary in preferred embodiments of the present invention that at least one external electrode is provided on the first principal surface 10a.

For example, as illustrated in FIGS. 13 and 14, first and second external electrodes 13 and 14 may preferably be arranged to cover a first and second end surface 10e and 10f and L1-side and L2-side portions of first and second principal surfaces 10a and 10b. In this case, second conductive layers 16 preferably cover not only L1-side and L2-side ends of first conductive layers 15, but also the first and second end surface 10e and 10f. This enables third conductive layers 17 made of plating films to also be provided on the first and second end surface 10e or 10f. For example, the second conductive layers 16 can preferably be formed by screen printing, or a dipping method in which ends of a ceramic element body 10 are dipped in conductive paste.

Alternatively, for example, as illustrated in FIG. 15, first and second external electrodes 13 and 14 may be configured so as to cover a L1-side and L2-side end of a first principal surface 10a and a first and second end surface 10e and 10f, without being provided on a second principal surface 10b.

The external electrodes may preferably be partially embedded in the ceramic element body. In this case, the first conductive layers preferably project from the ceramic element body by about 2 µm to about 10 µm, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ceramic electronic component comprising:
a ceramic element body having a substantially rectangular parallelepiped shape, and including first and second principal surfaces extending in a length direction and a width direction and facing each other, first and second side surfaces extending in the length direction and a thickness direction and facing each other, and first and second end surfaces extending in the width direction and the thickness direction and facing each other;
first and second internal electrodes provided in the ceramic element body such that at least portions of the first and second internal electrodes face each other in the thickness direction;
a first external electrode provided on one end of the first principal surface in the length direction and electrically connected to the first internal electrode; and
a second external electrode provided on another end of the first principal surface in the length direction and electrically connected to the second internal electrode; wherein
portions of the first and second external electrodes face, in the thickness direction, the at least portions of the first and second internal electrodes facing each other in the thickness direction;
the first and second external electrodes include projecting portions that project further than other portions of the first and second external electrodes in the thickness direction;
the projecting portion of the first external electrode is provided at one end of the first external electrode but not at another end of the first external electrode opposite to the one end of the first external electrode in the length direction and the projecting portion of the second external electrode is provided at one end of the second external electrode but not at another end of the second external electrode opposite to the one end of the second external in the length direction such that a concave portion is provided between the projecting portion of the first external electrode and the projecting portion of the second external electrode and so that a portion of the first principal surface provided between the first external electrode and the second external electrode is exposed;
both of the first external electrode and the second external electrode include lower step portions arranged at a height lower than a height of the projection portions;
upper surfaces of all of the projection portions and all of the lower step portions extend in parallel or substantially in parallel with the first and second principal surfaces of the ceramic element body;
each of the first and second external electrodes includes a plurality of conductive layers; and
an outermost conductive layer of the plurality of conductive layers of each of the first and second external electrodes entirely covers an underlying conductive layer of the plurality of conductive layers immediately adjacent to the outermost conductive layer.

2. The ceramic electronic component according to claim 1, wherein outermost layers of the first and second external electrodes are made of any one of Cu, Al, Au, and Ag or an alloy primarily including said any one of Cu, Al, Au, and Ag.

3. A wiring board comprising:
the ceramic electronic component according to claim 1; and
a wiring board body in which the ceramic electronic component is embedded.

4. The wiring board according to claim 3, wherein the wiring board body includes a base substrate, and an adhesive provided between the base substrate and the ceramic electronic component so as to bond the base substrate and the ceramic electronic component.

5. The wiring board according to claim 4, wherein the base substrate includes through holes that open toward the first and second external electrodes of the ceramic electronic component.

6. The wiring board according to claim 1, wherein the projecting portion of the first external electrode and the projecting portion of the second external electrode are disposed at opposite ends of the ceramic element body.

7. The wiring board according to claim 1, wherein the first external electrode and the projecting portion of the first external electrode include a first monolithic outermost layer and the second external electrode and the projecting portion of the second external electrode include a second monolithic outermost layer.

* * * * *